United States Patent [19]

Fujii

[11] Patent Number: 4,499,430
[45] Date of Patent: Feb. 12, 1985

[54] AUTOMATIC LEVEL CONTROL CIRCUIT
[75] Inventor: Akira Fujii, Tokyo, Japan
[73] Assignee: NEC Corporation, Tokyo, Japan
[21] Appl. No.: 556,632
[22] Filed: Nov. 30, 1983
[30] Foreign Application Priority Data
  Dec. 6, 1982 [JP] Japan ................................. 57-213673
[51] Int. Cl.³ ............................................. H03G 3/30
[52] U.S. Cl. ..................................... 330/279; 330/85; 330/282
[58] Field of Search .................. 330/85, 86, 278, 279, 330/280, 284, 254, 282

[56] References Cited
U.S. PATENT DOCUMENTS
  3,988,694 10/1976 Yamazaki ............................ 330/278

Primary Examiner—James B. Mullins
Assistant Examiner—G. Wan
Attorney, Agent, or Firm—Laff, Whitesel, Conte & Saret

[57] ABSTRACT

An automatic level control circuit is constituted by a variable gain amplifier means supplied with an input signal, for outputting a level controlled signal; detector means for detecting the output signal of the variable gain amplifier means; integration circuit means including an operational amplifier and a capacitor; means for applying an output voltage of the detector means to a first input terminal of the operational amplifier via a first resistor; means for applying a first reference voltage to the first input terminal via a second resistor; a first diode with one end connected to the output terminal of the operational amplifier and the other end connected to one end of the capacitor; a second diode connected between the other end of the capacitor and the first input terminal; a transistor with its first and second electrodes connected in parallel with the capacitor and its third electrode connected to the output terminal of the operational amplifier; and circuit means which decreases the gain of the variable gain amplifier means only when the output voltage of the integration circuit means appearing at the output terminal of the operational amplifier exceeds a second reference voltage.

4 Claims, 3 Drawing Figures

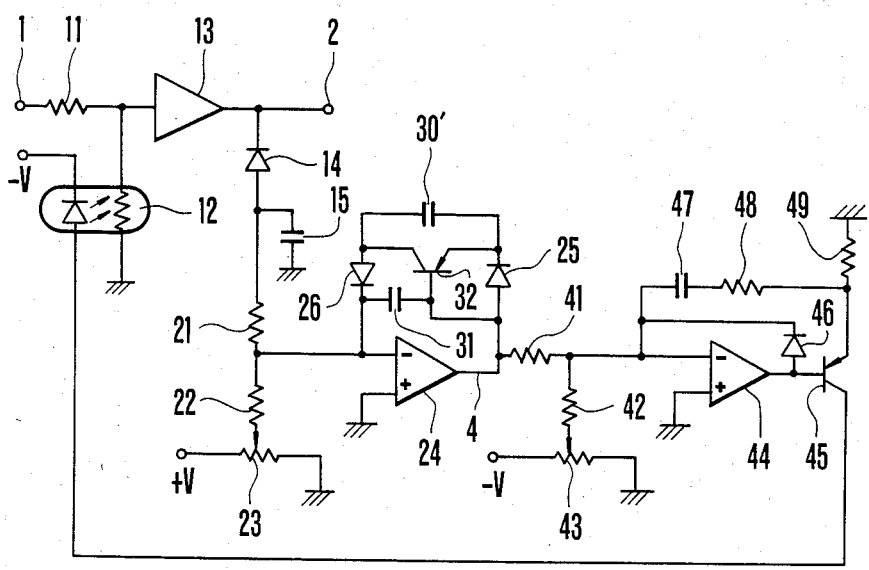
F I G. 2

AUTOMATIC LEVEL CONTROL CIRCUIT

BACKGROUND OF THE INVENTION

This invention relates to an automatic level control circuit in which, when the level of an input signal is lower than a reference value, the signal is passed as it is without being controlled, when the level exceeds continuously the reference value for a predetermined interval, the output level is decreased to the reference value, and when the level of the input signal is restored to a value less than the reference value, the level control is quickly stopped.

When transmitting a frequency division multiplexed telephone signal with a FM system by utilizing a satellite, for the purpose of effectively using the bandwidth and electric power, the margin for overload is small. For this reason, an automatic level control circuit mentioned above has been used for the transmitter of each ground station so that the level of a multiplexed telephone signal would not exceed a predetermined value over a long time.

A number of such automatic level control circuits have been proposed but such circuits have large size and large temperature dependent variation.

SUMMARY OF THE INVENTION

Accordingly, it is an object of this invention to provide an improved automatic level control circuit having a small size and a small temperature dependent variation.

According to this invention, there is provided an automatic level control circuit comprising: variable gain amplifier means which is supplied with an input signal, for outputting a level controlled signal; detector means for datecting the output signal of the variable gain amplifier; integration circuit means including an operational amplifier and a first capacitor; detector means for applying an output voltage of the detector to a first input terminal of the operational amplifier via a first resistor; means for applying a first reference voltage to the first input terminal via a second resistor; a first diode with one end connected to the output terminal of the operational amplifier and the other end connected to one end of the first capacitor; a second diode connected between the other end of the first capacitor and the first input terminal; a transistor with its first and second electrodes connected in parallel with the first capacitor, a third electrode of the transistor being connected to the output terminal of the operational amplifier; and circuit means which decreases the gain of the variable gain amplifier means only when the output voltage of the integration circuit means appearing at the output terminal of the operational amplifier exceeds a second reference voltage.

According to a modification of this invention, the integration circuit further comprises a second capacitor connected between the output terminal and the first input terminal of the operational amplifier. The output of the integration circuit is obtained at a junction between the first capacitor and the first diode.

BRIEF DESCRIPTION OF THE DRAWINGS

In the accompanying drawings:

FIGS. 2 and 3 are circuit diagrams showing different embodiments of this invention.

DESCRIPTION OF THE PREFERRED EMBODIMENTS

Figure 1:
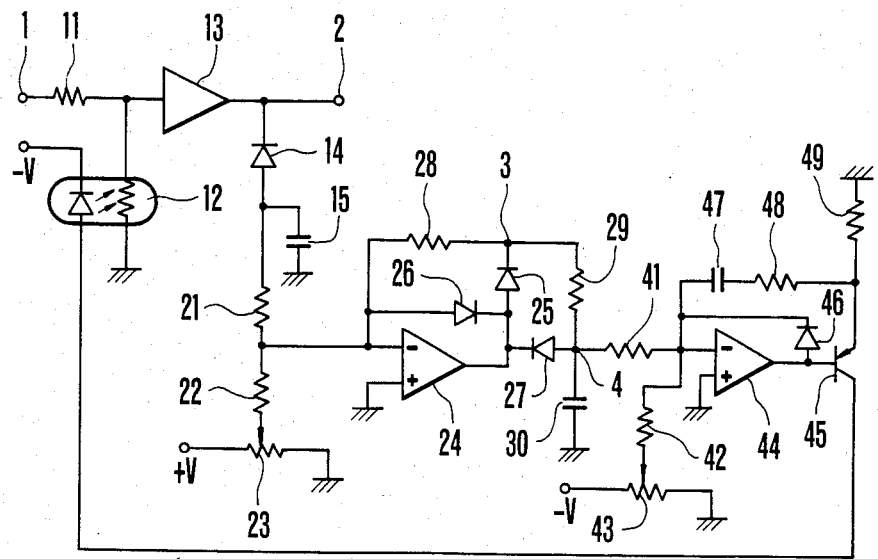
FIG. 1 is a circuit diagram showing a prior art automatic level control circuit.

To have better understanding of the invention, a typical prior art automatic level control circuit shown in FIG. 1 will first be described. The circuit shown in FIG. 1 comprises an input terminal 1 for receiving a multiplexed telephone signal and an output terminal 2. The input signal is divided by resistances of a resistor 11 and a CdS resistor of a photocell 12 and amplified by an amplifier 13 and then appears at the output terminal 2. A LED (Light Emitting Diode) is combined with the photocell 12 so that as the current flowing through LED increases, the resistance of the CdS resistor decreases to lower the output level at the output terminal 2. Thus, the output level at the output terminal 2 can be controlled by the current flowing through LED. Thus, the amplifier 13 and the photocell 12 constitute a variable gain amplifier. The output signal is detected or rectified by a detection circuit including a diode 14 and a capacitor 15 and the detected signal is inputted to the inverting input terminal of a first operational amplifier 24 via a resistor 21. A first reference voltage obtained by dividing a source voltage +V with a variable resistor 23 is also applied to the inverting input terminal of the first operational amplifier 21 via a resistor 22. The detector voltage and the first reference voltage have opposite polarities. Consequently, when the absolute value of the detector output voltage is larger than the first reference voltage, the output of the first operational amplifier would become a positive voltage so that the diode 25 becomes conductive, and a difference between the absolute value of the detector output voltage and the first reference voltage will appear at a junction 3 after being amplified with a ratio between resistances of resistors 21 and 28. The voltage at the junction charges a capacitor 30 through a resistor 29. The voltage at one terminal 4 of capacitor 30 is applied to the inverting input terminal of a second operational amplifier 44 via a resistor 41. A second reference voltage obtained by dividing a second source voltage −V with a variable resistor 43 is applied to the inverting terminal of the second operational amplifier 44 through a resistor 42. The second reference voltage and the voltage at the terminal 4 of capacitor 30 have opposite polarities. Consequently, while the absolute value of the voltage at terminal 4 is smaller than the absolute value of the second reference voltage, the output voltage of the second operational amplifier 44 is positive, thus cutting OFF a transistor 45. As a consequence, no current flows through the LED of photocell 12, and the output level at terminal 2 would not decrease. However, as the capacitor 30 is charged and the absolute value of the voltage at terminal 4 exceeds the absolute value of the second reference voltage, the output voltage of the second operational amplifier 44 becomes negative with the result that transistor 45 passes current through the LED of photocell 12, thus decreasing the output level at output terminal 2. Consequently, the detector output voltage decreases, and when its absolute value becomes equal to the first reference value, the operation of the circuit will be stabilized. As described above, when the input level exceeds the reference value, during an insensitive interval determined by the time at which the capacitor has charged up to a predetermined voltage, no level control is effected, and after lapse of the insensitive interval, level control becomes effective. Then when the input level decreases below the first reference value, the output of the first operational amplifier becomes negative, thus turning OFF diode 25 and turning ON diode 26. Furthermore, since diode 27 is turned ON, the capacitor 30 discharges quickly. Thus, the output voltage of the second operational amplifier 44 becomes positive and hence the transistor 45 is turned OFF so that no output level control is performed. Capacitor 47 and resistor 48 are provided for the purpose of making smooth the response of the circuit and for determining the response time at the time of recovery. Further, diode 46 is used to limit the output voltage of the second operational amplifier 44 while the control is not made. Reference numeral 49 denotes a resistor.

As described above, with the prior art circuit shown in FIG. 1, when the level of the input signal is lower than the reference value, the input signal is passed as it is without being controlled, but when the level of the input signal exceeds the reference value continuously for a certain interval, the output level is decreased to the reference value. When the level of the input signal is restored to a value less than the reference value, the control is stopped rapidly.

With this prior art circuit, in order to ensure that the first operational amplifier 24 does not saturate even when the increase in the input level is large, it is necessary to prevent an excessive increase in the gain of the first operational amplifier. Consequently, when the difference between the absolute value of the detector output voltage and the first reference voltage is small while the control is being made, the output of the first operational amplifier 24 would become small with the result that the terminal voltage of the capacitor 30 would also become small. For this reason, as will be described later, actually it has been obliged to make the second reference voltage set by the variable resistor 43 of 0 V or a small value close to 0 V. Moreover, it is necessary to make large the gain of the second operational amplifier 44. For the reasons described above, the following two defects result. Firstly, it is necessary to make large the capacitance of capacitor 30 owing to the fact that the voltage is low and that it is impossible to make large the resistance of resistor 41. Thus, it is necessary to use a large capacity of 3000 microfarads, for example. Secondly, it becomes impossible to ignore the influence of the voltage drop across the diode 27, thus increasing temperature dependent variation.

To make more clear the defects of the prior art control circuit, let us calculate the insensitive interval as follows. Suppose now that in the circuit shown in FIG. 1, the input level rises stepwise so that the detected output voltage of the diode 14 becomes $-V_{in}$. Denoting the first reference voltage by $V_{ref}$, the voltage $V_3$ at the junction 3 can be expressed by $$V_3 = \frac{R28}{R21}(V_{in} - V_{ref}) \quad (1)$$

Consequently, the voltage $V_4$ at junction 4, t seconds later, can be given by the following equation:

$$V_4 = \left(\frac{R41}{R41 + R29} V_3 + V_{off}\right)\{1 - \exp(-t/T_c)\} - V_{off} \quad (2)$$

-continued $$\text{where } T_c = \frac{R41 \cdot R29}{R41 + R29} \cdot C_{30} \quad (3)$$

In the foregoing and ensuing equations, a suffixed R represents the resistance of resistor R specified by the suffix, C30 the capacitance of capacitor 30, and $-V_{off}$ the voltage at junction 4 when the input level is less than the reference value.

As the voltage at junction $V_4$ exceeds the second reference voltage, the control is commenced. But, as can be noted from equation (2), when time t becomes infinite, $V_4$ converges to $V_3 \times R41/(R41+R29)$ and never exceeds this value.

As shown by equation (1), since $V_3$ is proportional to the difference between the detected voltage and the first reference voltage, $V_4$ becomes a value very close to zero so that it becomes necessary to make the second reference voltage to be a value smaller than this, that is, substantially 0 V when the circuit is constructed such that when the detected voltage slightly exceeds the first reference voltage, the control operation is commenced. Thus, the insensitive interval of this circuit is determined by the interval over which $V_4$ determined by equation (2) decreases to 0 V. Denoting this interval by $t_1$, $$t_1 = -T_c \log\left(1 - \frac{V_{off}}{V_3 \cdot R41/(R41 + R29) + V_{off}}\right) \quad (4)$$

$$\approx \frac{T_c V_{off}}{V_3 \cdot R41/(R41 + R29) + V_{off}} \quad (5)$$

Thus, the insensitive interval $t_1$ of the prior art control circuit greatly depends on $V_{off}$. But as can be clearly noted from FIG. 1, when the input level is less than the reference value, the output voltage of the operational amplifier 24 becomes negative. However, since diode 26 is turned ON, this output voltage becomes negative with respect to the ground voltage by a forward voltage drop VD26 of the diode 26. The junction 4 is connected to the output terminal of the operational amplifier 24 through diode 27, and the diode 27 is also turned ON. Consequently the junction 4 becomes more positive than the output terminal voltage of the operational amplifier 24 by a forward voltage drop VD27 of diode 27. Thus, the voltage $-V_{off}$ of the junction 4 is given by $$-V_{off} = -VD26 + VD27 \quad (6)$$

Where diodes 26 and 27 are silicon diodes, VD26 is about 0.6 V, but since the current flowing through diode 27 is extremely small, VD27 is about 0.2 V. Thus, $V_{off}$ becomes an extremely small value of about 0.4 V, and since it is determined by the characteristic of the diode, the temperature dependent variation is large.

Assuming that typical values are $V_{in}=0.70$ V, $V_{ref}=0.63$ V, R21=6.8 KΩ, R28=128 KΩ, R29=100 KΩ, R41=180 KΩ, C30=3000 μF, it follows that from equation (1), $V_3$ is 1.32 V and from equation (3), $T_c$ is 193 seconds. Assuming that $V_{off}=0.4$ V, it follows that from equation (4), $t_1$ is 74.5 seconds.

As described above, with the prior art circuit, in order to obtain an insensitive interval of 74.5 sec, it is necessary to use a large capacitance of 3000 μF.

Moreover, as has been pointed above, the insensitive interval depends on the characteristics of diodes 26 and 27 so that there is a defect that the temperature dependent variation is large.

Thus, the prior circuit is large not only in size but also in temperature dependent variation. This invention contempletes elimination of these defects.

FIG. 2 shows one embodiment of this invention in which elements corresponding to those shown in FIG. 1 are designated by the same reference characters. The principal difference between FIGS. 1 and 2 lies in the elements provided around the first operational amplifier 24. When the input level becomes larger than the reference value, the absolute value of the detected output voltage becomes larger than the absolute value of the first reference voltage set by the variable resistor 23 and the output voltage of the first operational amplifier 24 becomes positive. For this reason, diodes 25 and 26 are turned ON to charge a first capacitor 30'. When the absolute value of the voltage at the output terminal 4 of the first operational amplifier becomes larger than the absolute value of the second reference voltage set by the variable resistor 43, the output voltage of the second operational amplifier 44 becomes negative thus initiating the control in the same manner as in the prior art circuit shown in FIG. 1. However, in the control circuit of this invention shown in FIG. 2, since the first operational amplifier 24 and the first capacitor 30' constitute an integration circuit, it would not saturate for a large input, thus maintaining the integration time at an inverse proportional relationship with respect to the difference in the input levels. For this reason, it is possible to make large the second reference voltage set by the variable resistor 43. In addition to this fact, because of the fact that the resistor 41 which shortens the charging time constant in the prior art circuit has no relation to the charging time constant in this invention, the capacitance of the first capacitor 30' may advantageously be only about 5 microfarads to obtain the same time constant.

To make more clear the advantages of the control circuit of this invention, let us calculate the insensitive interval. In the circuit shown in FIG. 2, assuming that the input level rises stepwise so that the detected output voltage of diode 14 becomes $-V_{in}$, and that the first reference voltage is expressed by $V_{ref}$, the voltage $V_4$ at the output terminal 4 of the operational amplifier 24 after t seconds will be given by $$V_4 = (V_{in} - V_{ref}) \frac{t}{R21 \cdot C30'} + VD25 + VD26 \quad (7)$$

The interval over which this voltage reaches the second reference voltage $V_{ref2}$ is the insensitive time $t_2$ which is calculated by the following equation:

$$t_2 = \frac{V_{ref2} - VD25 - VD26}{V_{in} - V_{ref}} \cdot R21 \cdot C30' \quad (8)$$

Assuming values of $V_{in}=0.70$ V, $V_{ref}=0.63$ V, $R32=147$ KΩ, $C30'=5$ μF, and $V_{ref}=10$ V, it will follow that from equation (8), $t_2$ is 95 seconds since the forward voltage drops VD25 and VD26 across diodes 25 and 26 are respectively about 0.5 V.

As described above, with the control circuit of this invention, substantially the same time constant can be obtained with a small capacitance of only 5 μF which is much smaller than 3000 μF necessary for the prior art circuit.

In the circuit shown in FIG. 2, as can be noted from equation (8), the time constant $t_2$ is influenced by the forward voltage drops across diodes 25 and 26 but, by setting $V_{ref2}$ to be sufficiently larger than VD25 and VD26, the adverse effect of the temperature dependent variation can be greatly alleviated. Furthermore, it is possible to make negligible the effect of the temperature dependent variation of the diodes 25 and 26 by temperature compensating $V_{ref2}$.

At the time of charging, the base electrode of transistor 32 connected in parallel with the first capacitor 30' is reversely biased to turn OFF this transistor. However, when the input level becomes lower than the reference value, the output voltage of the first operational ampliier 24 becomes negative, thus turning OFF diode 25. Accordingly, the base electrode of transistor 32 is forwardly biased to be turned ON. For this reason, the charge of the first capacitor 30' is guickly discharged, thus stopping the control.

In the absence of the diode 26, as the input level becomes slightly lower than the reference value, the discharge current of capacitor 30' flows into the capacitor 30' through the input terminal of the operational amplifier 24 to prevent the input terminal voltage of the operational amplifier from changing from negative to positive. Consequently, variation of the output voltage of the operational amplifier 24 from positive to negative is delayed by a negative feedback operation with the result that the discharge speed of capacitor 30' decreases. Thanks to the provision of diode 26, the discharge current of capacitor 30' is blocked by diode 26 so that no current flows into the input terminal of the operational amplifier 24. Thus, the input terminal voltage immediately turns to positive, whereby the output voltage of the operational amplifier 24 also immediately changes to negative, thus causing the capacitor 30 to quickly discharge.

Thus, according to this invention, not only the same characteristic as that of the prior art circuit can be obtained but also the first capacitor 30 as well the temperature dependent variation can be made small. Thus, according to this invention, the size of the control circuit can be reduced and the operation thereof can be stabilized.

The purpose of a second capacitor 31 connected between the output terminal and the inverting input terminal of the first operational amplifier 24 is as follows. More particularly, in the absence of the second capacitor 31, even when the input level decreases slightly during controlling, the output voltage of the first operational amplifier 24 immediately becomes negative to turn ON transistor 32, thereby discharging the first capacitor 30'. Then the output level rises again so that the output voltage of the first operational amplifier 24 again becomes positive to charge the first capapcitor 30'. Thus, there is a tendency of oscillating the level. Provision of the second capacitor 31, however prevents rapid change in the output voltage of the first operational amplifier 24, thereby stabilizing the operation.

Figure 3:
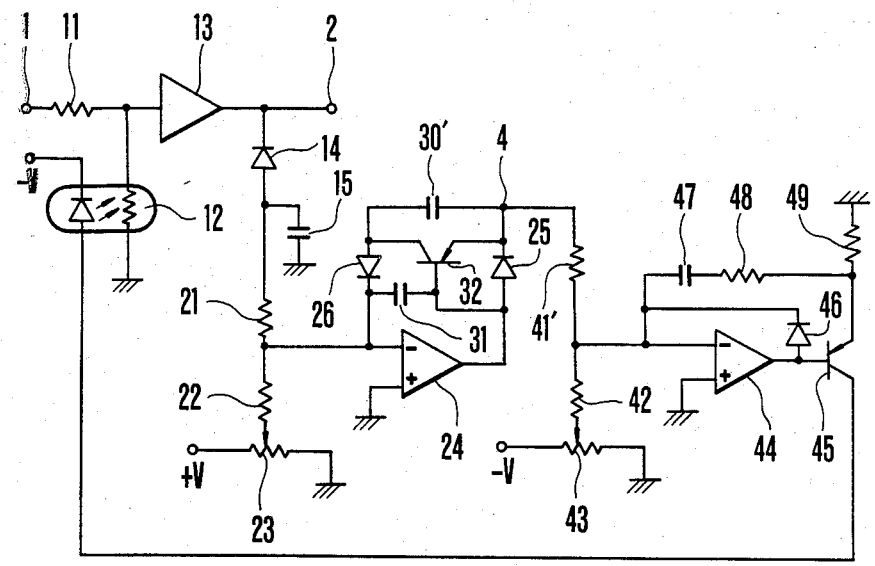

Although in the embodiment shown in FIG. 2, the output terminal of the first operational amplifier is connected to the input terminal of the second operational amplifier via resistor 41, substantially the same circuit operation can also be obtained by connecting to the input terminal of the second operational amplifier, the junction between diode 25 and capacitor 30' through resistor 41' as the output of an intergration circuit, as shown in FIG. 3.

In the foregoing embodiments, the variable gain amplifier was constituted by amplifier 13 and photocell 12, but it may can be constituted by an FET or the like. Furthermore, in the foregoing embodiment the detector was constituted with only one diode, a full-wave rectifier can be substituted for.

Furthermore, in the foregoing embodiment a combination of an operational amplifier 44 and a transistor 45 was used as a circuit for initiating the control operation when the output voltage of the integration circuit exceeds the second reference voltage, and it will be clear that this circuit should be designed by taking into consideration the characteristics of the control elements of the variable gain amplifier. Any circuit having similar performance can be used.

While, in the foregoing embodiment, the polarity of the detector output voltage was negative, it may be positive and the same operation may be achieved by inverting the polarities of the other elements of the circuit.

As described above, according to this invention, the first capacitor can be made to be small, thus miniaturizing the automatic level control circuit with a small temperature dependent variation. Furthermore, by providing a second capacitor for the integration circuit, the operation of the control circuit can be stabilized.

What is claimed is:

1. An automatic level control circuit comprising:
    variable gain amplifier means which is supplied with an input signal, for outputting a level controlled signal;
    detector means for detecting the output signal of said variable gain amplifier means;
    integration circuit means including an operational amplifier and a first capacitor;
    means for applying an output voltage of said detector means to a first input terminal of said operational amplifier via a first resistor;
    means for applying a first reference voltage to said first input terminal via a second resistor;
    a first diode with one end connected to an output terminal of said operational amplifier and the other end connected to one end of said first capacitor;
    a second diode connected between the other end of said first capacitor and said first input terminal;
    a transistor with its first and second electrodes connected in parallel with said first capacitor, a third electrode of said transistor being connected to the output terminal of said operational amplifier; and
    circuit means which decreases the gain of said variable gain amplifier means only when an output voltage of said integration circuit means appearing at the output terminal of said operational amplifier exceeds a second reference voltage.

2. The automatic level control circuit according to claim 1 wherein said integration circuit means further comprises a second capacitor connected between said output terminal and said first input terminal of said operational amplifier.

3. The automatic level control circuit according to claim 1 wherein said output voltage of said integration circuit means is obtained at a junction between said first capacitor and said first diode.

4. The automatic level control circuit according to claim 2 wherein said output voltage of said integration circuit means is obtained at a junction between said first capacitor and said first diode.

* * * * *